United States Patent
Lv et al.

(10) Patent No.: US 11,456,387 B2
(45) Date of Patent: Sep. 27, 2022

(54) NORMALLY-OFF GALLIUM OXIDE FIELD-EFFECT TRANSISTOR STRUCTURE AND PREPARATION METHOD THEREFOR

(71) Applicant: THE 13TH RESEARCH INSTITUTE OF CHINA ELECTRONICS TECHNOLOGY GROUP CORPORATION, Shijiazhuang (CN)

(72) Inventors: Yuanjie Lv, Shijiazhuang (CN); Yuangang Wang, Shijiazhuang (CN); Xingye Zhou, Shijiazhuang (CN); Xin Tan, Shijiazhuang (CN); Xubo Song, Shijiazhuang (CN); Shixiong Liang, Shijiazhuang (CN); Zhihong Feng, Shijiazhuang (CN)

(73) Assignee: THE 13TH RESEARCH INSTITUTE OF CHINA ELECTRONICS TECHNOLOGY GROUP CORPORATION, Shijiazhuang (CN)

( * ) Notice: Subject to any disclaimer, the term of this patent is extended or adjusted under 35 U.S.C. 154(b) by 33 days.

(21) Appl. No.: 17/061,261

(22) Filed: Oct. 1, 2020

(65) Prior Publication Data
US 2021/0098628 A1   Apr. 1, 2021

Related U.S. Application Data

(63) Continuation of application No. PCT/CN2018/121422, filed on Dec. 17, 2018.

(30) Foreign Application Priority Data

Dec. 6, 2018 (CN) .......................... 201811488059.4

(51) Int. Cl.
*H01L 29/786* (2006.01)
*H01L 21/477* (2006.01)
(Continued)

(52) U.S. Cl.
CPC ........ *H01L 29/7869* (2013.01); *H01L 21/477* (2013.01); *H01L 29/24* (2013.01);
(Continued)

(58) Field of Classification Search
None
See application file for complete search history.

(56) References Cited

U.S. PATENT DOCUMENTS 6,989,556 B2    1/2006   Braddock
2010/0213460 A1*  8/2010  Kondo ................ H01L 27/1259
                                                            257/E29.296
(Continued)

FOREIGN PATENT DOCUMENTS

| CN | 101410985 A | 4/2009 |
|---|---|---|
| CN | 107481939 A | 12/2017 |
| CN | 108649070 A | 10/2018 |

*Primary Examiner* — Vincent Wall
(74) *Attorney, Agent, or Firm* — Slater Matsil, LLP

(57) ABSTRACT

The disclosure provides a normally-off gallium oxide field-effect transistor structure and a preparation method therefor, and relates to the technical field of semiconductor device. The normally-off gallium oxide field-effect transistor structure comprises a substrate layer and an n-type doped gallium oxide channel layer from bottom to top. The n-type doped gallium oxide channel layer is provided with a source, a drain, and a gate. The gate is located between the source and the drain. A no-electron channel region is provided in the n-type doped gallium oxide channel layer located below the gate.

5 Claims, 2 Drawing Sheets

(51) Int. Cl.
   *H01L 29/24* (2006.01)
   *H01L 29/40* (2006.01)
   *H01L 29/66* (2006.01)
   *H01L 29/78* (2006.01)

(52) U.S. Cl.
   CPC ...... *H01L 29/404* (2013.01); *H01L 29/66969* (2013.01); *H01L 29/7839* (2013.01)

(56) References Cited

U.S. PATENT DOCUMENTS

| | | | |
|---|---|---|---|
| 2010/0264412 A1* | 10/2010 | Yamazaki | H01L 27/12 257/E21.462 |
| 2019/0027590 A1* | 1/2019 | Lv | H01L 29/78 |
| 2021/0043778 A1* | 2/2021 | Lv | H01L 29/0619 |

* cited by examiner

NORMALLY-OFF GALLIUM OXIDE FIELD-EFFECT TRANSISTOR STRUCTURE AND PREPARATION METHOD THEREFOR

CROSS-REFERENCE TO RELATED APPLICATIONS

This application is a continuation application of International Application No. PCT/CN2018/121422, filed on Dec. 17, 2018, which claims priority to Chinese Patent Application No. CN201811488059.4, filed on Dec. 6, 2018. The disclosures of the aforementioned applications are hereby incorporated herein by reference in their entireties.

TECHNICAL FIELD

The disclosure relates to the technical field of semiconductor device, in particular to a normally-off gallium oxide field-effect transistor structure and a preparation method therefor.

BACKGROUND

Due to the lack of efficient P-type doping and implantation techniques, normally-off gallium oxide field-effect transistors are usually implemented with under-gate deep groove technology, which are typically implemented by dry etching. A normally-off gallium oxide field-effect transistor device is realized by utilizing an under-gate deep groove technology, which may result that the etching depth is uncontrollable, and the threshold value is unstable. Gallium oxide has strong etching resistance, and dry etching may lead to rough and uneven surface of the under-gate groove, so that a peak electric field appears in the under-gate region when the device works. The breakdown characteristic of the device is influenced, meanwhile, the etching may lead to the problem of material damage, and the saturation current and the breakdown voltage of the device are seriously influenced.

SUMMARY

These and other problems are generally solved or circumvented, and technical advantages are generally achieved, by embodiments of the present disclosure which provide a normally-off gallium oxide field-effect transistor structure and a preparation method therefor.

Technical Problem

The disclosure aims to provide a normally-off gallium oxide field-effect transistor structure, and aims to solve the technical problems of uncontrollable etching depth, etching damage, rough surface, unstable threshold value, serious influence on saturation current and breakdown voltage and the like in the existing under-gate deep groove technology.

Technical Solution

For these purposes, the technical solution of the present application is to provide a normally-off gallium oxide field-effect transistor structure, comprising a substrate layer and an n-type doped gallium oxide channel layer from bottom to top, the n-type doped gallium oxide channel layer being provided with a source, a drain and a gate, the gate being located between the source and the drain, and a no-electron channel region being provided in the n-type doped gallium oxide channel layer below the gate.

In one embodiment, a length of the no-electron channel region is less than or equal to a length of the gate.

In one embodiment, one or more no-electron channel regions are provided in the n-type doped gallium oxide channel layer, a number of the one or more no-electron channel regions is an integer greater than or equal to 1, and the normally-off gallium oxide field-effect transistor structure comprises one or more gates, and a number of the one or more gates is an integer greater than or equal to 1, and the one or more no-electron channel regions are all located below the one or more gates.

In one embodiment, the substrate layer is at least one layer of a semiconductor material, a metal material or an insulating medium, the substrate layer connected to the n-type doped gallium oxide channel layer being an insulating medium layer.

In one embodiment, the substrate layer comprises a sapphire substrate layer and a gallium oxide channel layer from bottom to top.

In one embodiment, the n-type doped gallium oxide channel layer comprises a first n-type doped gallium oxide channel layer and a second n-type doped gallium oxide channel layer from bottom to top, a doping concentration of the first n-type doped gallium oxide channel layer and a doping concentration of the second n-type doped gallium oxide channel layer being unequal.

In one embodiment, the source and the drain form ohmic contact by ion implantation and high-temperature annealing, or form ohmic contact by high-temperature alloying.

In one embodiment, the source and the n-type doped gallium oxide channel layer form Schottky contact, or the drain and the n-type doped gallium oxide channel layer form Schottky contact.

In one embodiment, the normally-off gallium oxide field-effect transistor structure further comprises field plates, the field plates being a source field plate, a gate field plate and a drain field plate, or being any one or two of the source field plate, the gate field plate and the drain field plate.

In one embodiment, the source field plate, the gate field plate, and the drain field plate each have at least one layer.

In one embodiment, a gate medium layer is provided between the n-type doped gallium oxide channel layer and the gate.

In one embodiment, a passivation layer is provided between the source and the gate, and between the drain and the gate.

In one embodiment, the passivation layer is one layer or multiple layers of insulating medium.

Another purpose of the present application is to provide a preparation method for a normally-off gallium oxide field-effect transistor structure, and the preparation method includes:

depositing a mask layer on the n-type doped gallium oxide channel layer, the mask layer being a metal or an insulating medium; removing the mask layer above the no-electron channel region to be manufactured by utilizing a photoetching, developing, dry etching or wet etching method; and performing high-temperature annealing in an oxygen atmosphere to form a no-electron channel region.

In one embodiment, the high-temperature annealing is performed at a temperature of 300° C.-1300° C., and a time period of the high-temperature annealing is greater than or equal to 30 seconds.

Advantageous Effects of the Disclosure

According to the disclosure, a dry etching process is not required, and the problems of rough surface, material damage, non-uniform etching and the like caused by etching are avoided. A leakage characteristic of a device is reduced, and a voltage resistance characteristic and a switching characteristic of a device are improved, meanwhile a uniformity of a threshold voltage of a device can be improved, and large-scale production is facilitated. In addition, defects of materials in the mask region can be repaired through the high-temperature annealing, and device performance is expected to be further improved.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

In order to more clearly illustrate the technical solutions in the embodiments of the present application, the embodiments or the drawings used in the prior art description will be briefly described below, and it is obvious that the drawings in the following description are only some embodiments of the present application, and that other drawings can be obtained from these drawings without involving any inventive effort for a person skilled in the art.

Figure 1:
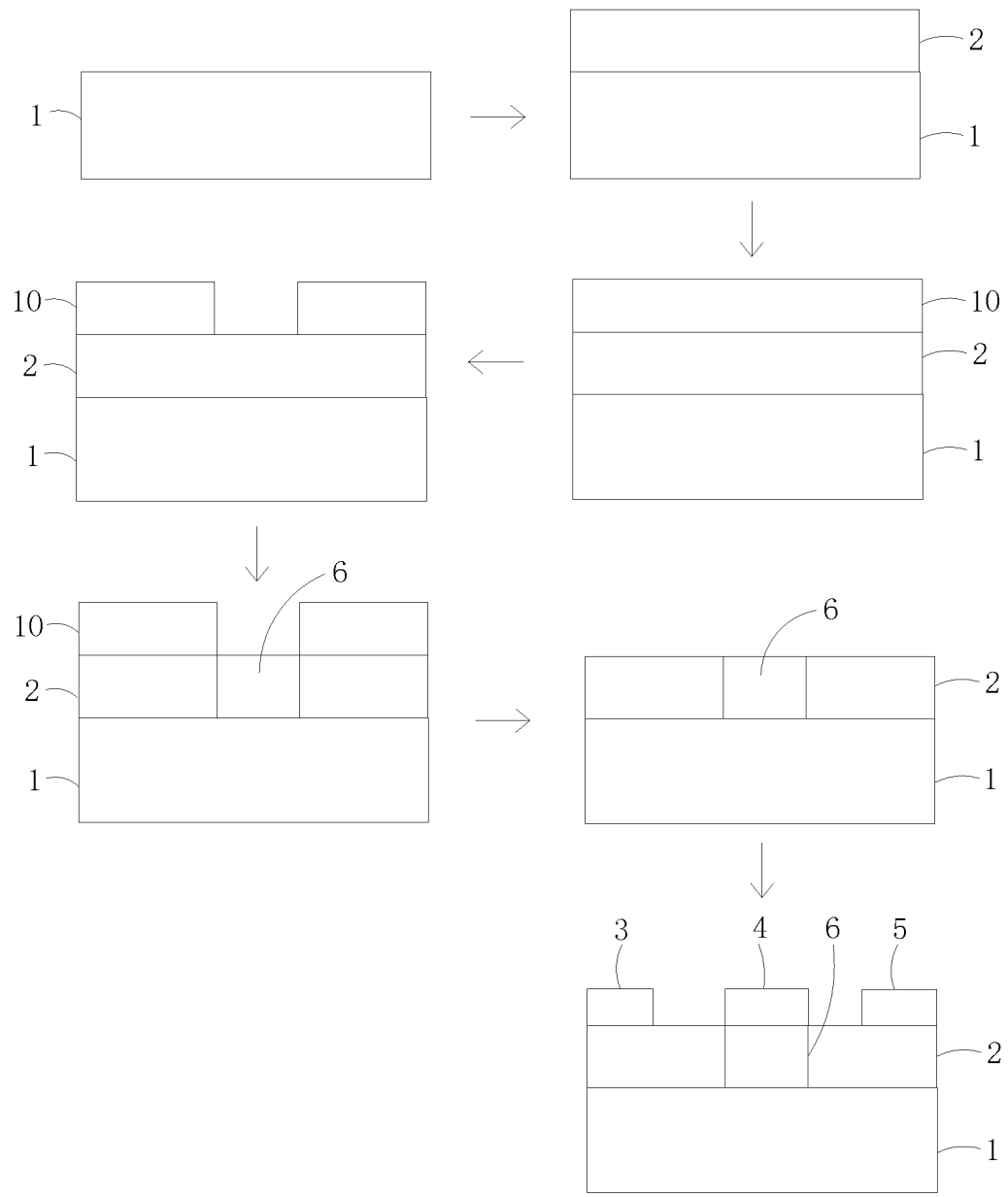
FIG. 1 is a schematic structural diagram of a normally-off gallium oxide field-effect transistor structure according to an embodiment of the present application.

In the drawings:
1—substrate layer; 11—sapphire substrate layer; 12—gallium oxide channel layer; 2—n-type doped gallium oxide channel layer; 21—first n-type doped gallium oxide channel layer; 22—second n-type doped gallium oxide channel layer; 3—source; 4—gate; 5—drain; 6—no-electron channel region; 7—gate medium layer; 8—passivation layer; 9—gate field plate, 10—mask layer.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In order to clearly understand the technical problems to be solved by the present application, technical solutions and beneficial effects, the present application is described in further detail with reference to the accompanying drawings and embodiments. It should be understood that the specific embodiments described herein are merely illustrative of the present application and are not intended to be limiting thereof.

Figure 2:
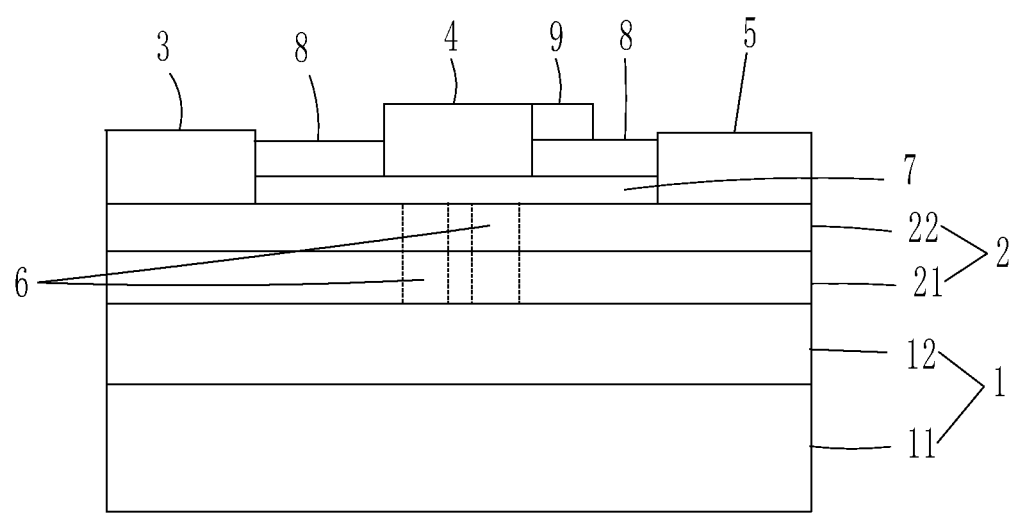
FIG. 2 is a schematic structural diagram of a normally-off gallium oxide field-effect transistor structure with a gate field plate according to an embodiment of the present application.

With reference to FIG. 1-FIG. 2 together, the normally-off gallium oxide field-effect transistor structure provided by the present application will now be described. The normally-off gallium oxide field-effect transistor structure comprises a substrate layer 1 and an n-type doped gallium oxide channel layer 2 from bottom to top, and the n-type doped gallium oxide channel layer 2 is provided with a source 3, a drain 5 and a gate 4. The gate 4 is located between the source 3 and the drain 5, and a no-electron channel region 6 is provided in the n-type doped gallium oxide channel layer 2 below the gate 4.

Compared with the prior art, the normally-off gallium oxide field-effect transistor structure provided by the disclosure does not require a dry etching process, and thus avoids the problems of rough surface, material damage, non-uniform etching and the like caused by etching, which is favorable for reducing the leakage characteristic of the device, improving the voltage resistance characteristic and the switching characteristic of the device, simultaneously improving the uniformity of the threshold voltage of the device and large-scale production.

With reference to FIG. 1, as one embodiment of the normally-off gallium oxide field-effect transistor structure provided by the present application, a length of the no-electron channel region 6 is less than or equal to a length of the gate 4.

With reference to FIG. 1, as one embodiment of the normally-off gallium oxide field-effect transistor structure provided by the present application, one or more no-electron channel regions are provided in the n-type doped gallium oxide channel layer, and a number of the one or more no-electron channel regions 6 is an integer greater than or equal to 1, and the normally-off gallium oxide field-effect transistor structure comprises one or more gates, and a number of the one or more gates 4 is an integer greater than or equal to 1, and the one or more no-electron channel regions 6 are all located below the one or more gates 4.

With reference to FIG. 1, as one embodiment of the normally-off gallium oxide field-effect transistor structure provided by the present application, the substrate layer 1 is at least one layer of a semiconductor material, a metal material or an insulating medium, the substrate layer 1 connected to the n-type doped gallium oxide channel layer 2 being an insulating medium layer. The semiconductor material is $Ga_2O_3$, GaN, AlN and the like, and the metal material is nickel, titanium, platinum, tungsten and the like, and the insulating medium is SiO2, SiN, $Al_2O_3$ and the like.

With reference to FIG. 2, as one embodiment of the normally-off gallium oxide field-effect transistor structure provided by the present application, the substrate layer 1 comprises a sapphire substrate layer 11 and a gallium oxide channel layer 12 from bottom to top.

With reference to FIG. 2, as one embodiment of the normally-off gallium oxide field-effect transistor structure provided by the present application, the n-type doped gallium oxide channel layer 2 comprises a first n-type doped gallium oxide channel layer 21 and a second n-type doped gallium oxide channel layer 22 from bottom to top, a doping concentration of the first n-type doped gallium oxide channel layer and a doping concentration of the second n-type doped gallium oxide channel layer being unequal. Different concentration of the two layers is beneficial to improving transconductance of the device and improving the voltage resistance characteristic of the device.

With reference to FIG. 1, as one embodiment of the normally-off gallium oxide field-effect transistor structure provided by the present application, the source 3 and the drain 5 form ohmic contact by ion implantation and high-temperature annealing, or form ohmic contact by high-temperature alloying.

With reference to FIG. 1, as one embodiment of the normally-off gallium oxide field-effect transistor structure provided by the present application, the source 3 and the n-type doped gallium oxide channel layer form Schottky contact, or the drain 5 and the n-type doped gallium oxide channel layer form a Schottky contact.

With reference to FIG. 2, as one embodiment of the normally-off gallium oxide field-effect transistor structure provided by the present application, the normally-off gallium oxide field-effect transistor structure further comprises field plates, the field plates include a source field plate, a gate field plate 9 and a drain field plate, or include any one or two of the source field plate, the gate field plate 9 and the drain field plate.

With reference to FIG. 2, as one embodiment of the normally-off gallium oxide field-effect transistor structure provided by the present application, the source field plate, the gate field plate 9 and the drain field plate each have at least one layer. The field plate structure is beneficial to restraining a peak electric field of the channel of the device and improving the voltage resistance characteristic of the device.

With reference to FIG. 2, as one embodiment of the normally-off gallium oxide field-effect transistor structure provided by the present application, a gate medium layer 7 is provided between the n-type doped gallium oxide channel layer and the gate 4.

With reference to FIG. 2, as one embodiment of the normally-off gallium oxide field-effect transistor structure provided by the present application, a passivation layer 8 is provided between the source 3 and the gate 4, and between the drain 5 and the gate 4.

With reference to FIG. 2, as one embodiment of the normally-off gallium oxide field-effect transistor structure provided by the present application, the passivation layer 8 is one layer or multiple layers of insulating medium.

The disclosure also provides a preparation method for the normally-off gallium oxide field-effect transistor structure, and the preparation method includes:

depositing a mask layer 10 on the n-type doped gallium oxide channel layer 2, the mask layer 10 being a metal or an insulating medium;

removing the mask layer 10 above the no-electron channel region 6 to be manufactured by utilizing a photoetching, developing, dry etching or wet etching method; and performing high-temperature annealing in an oxygen atmosphere to form a no-electron channel region 6.

The high-temperature annealing is performed at a temperature of 300° C.-1300° C., and a time period of the high-temperature annealing is greater than or equal to 30 seconds.

The preparation method has the beneficial effects that a dry etching process is not required, and the problems of surface roughness, material damage, non-uniform etching and the like caused by etching are avoided. The leakage characteristic of the device is favorably reduced, and the voltage resistance characteristic and the switching characteristic of the device are improved, meanwhile the uniformity of the threshold voltage of the device can be improved, and the large-scale production is facilitated. In addition, the defects of materials in the mask region can be repaired through high-temperature annealing, and the device performance is expected to be further improved.

The foregoing description is of embodiments of the disclosure and is not intended to limit the disclosure, but on the contrary, the disclosure is to cover all modifications, equivalents, and alternatives within the spirit and principle of the present application into the scope of protection of the disclosure.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A preparation method for a normally-off gallium oxide field-effect transistor structure, wherein the preparation method comprises:
   providing a substrate layer;
   forming a n-type doped gallium oxide channel layer on the substrate layer;
   depositing a mask layer on the n-type doped gallium oxide channel layer, the mask layer being a metal or an insulating medium;
   removing the mask layer on a portion of the n-type doped gallium oxide channel layer by utilizing a photoetching, developing, dry etching or wet etching method, whereby obtaining a remaining mask layer on the n-type doped gallium oxide channel layer and exposing the portion of the n-type doped gallium oxide channel layer;
   performing a high-temperature annealing in an oxygen atmosphere to form an annealed region within the portion of the n-type doped gallium oxide channel layer;
   removing the remaining mask layer after performing the high-temperature annealing;
   forming a gate on the annealed region; and
   forming a source and a drain on the n-type doped gallium oxide channel layer, the gate being located between the source and the drain.

2. The preparation method of claim 1, wherein the high-temperature annealing is performed at a temperature of 300° C.-1300° C., and a time period of the high-temperature annealing is greater than or equal to 30 seconds.

3. The preparation method of claim 1, wherein a length of the annealed region is less than or equal to a length of the gate.

4. The preparation method of claim 1, wherein one or more annealed regions are provided in the n-type doped gallium oxide channel layer, a number of the one or more annealed regions is an integer greater than or equal to 1, and wherein the normally-off gallium oxide field-effect transistor structure comprises one or more gates, and a number of the one or more gates is an integer greater than or equal to 1, and the one or more annealed regions are all located below the one or more gates.

5. The preparation method of claim 1, wherein the substrate layer is at least one layer of a semiconductor material, a metal material or an insulating medium, the substrate layer connected to the n-type doped gallium oxide channel layer being an insulating medium layer.

\* \* \* \* \*